United States Patent [19]

Fujiwara

[11] Patent Number: 5,001,427
[45] Date of Patent: Mar. 19, 1991

[54] BROADBAND SPIN-LOCKING METHOD

[75] Inventor: Toshimichi Fujiwara, Tokyo, Japan

[73] Assignee: JEOL Ltd., Tokyo, Japan

[21] Appl. No.: 425,732

[22] Filed: Oct. 23, 1989

[30] Foreign Application Priority Data

Oct. 24, 1988 [JP] Japan .................................. 63-267958

[51] Int. Cl.⁵ ............................................. G01R 33/20
[52] U.S. Cl. ..................................... 324/307; 324/300
[58] Field of Search ............... 324/300, 307, 308, 309, 324/310, 311, 312, 313, 314, 315

[56] References Cited

U.S. PATENT DOCUMENTS

| | | | |
|---|---|---|---|
| 3,824,452 | 7/1974 | Freeman | 324/314 |
| 3,858,111 | 12/1974 | Simpson | 324/310 |
| 4,168,462 | 9/1979 | Ernst | 324/313 |
| 4,297,637 | 10/1981 | Crooks | 324/309 |
| 4,820,983 | 4/1989 | Bendall | 324/307 |

OTHER PUBLICATIONS

"Radiofrequency Pulse Sequences Which Compensate Their Own Imperfections", Ray Freeman, Stewart P. Kempsell and Malcolm H. Levitt, Journal of Magnetic Resonance 38, 453–479 (1980).

"Practical Aspects of Two-Dimensional Transverse NOE Spectroscopy", by Ad Bax and Donald G. Davis, Journal of Magnetic Resonance, 63, pp. 207–213 (1985).

"The Principles of Nuclear Magnetism", Chaps. 1,2, by A. Abragam, Oxford Univ. Press. London, 1961.

"Frequency Offset Effects and Their Elimination in NMR Rotating-Frame Cross-Relaxation Spectroscopy", C. Griesinger and R. R. Ernst, Journal of Magnetic Resonance, 75, 261–271 (1987).

Primary Examiner—Michael J. Tokar
Attorney, Agent, or Firm—Webb, Burden, Ziesenheim & Webb

[57] ABSTRACT

An NMR spectroscopy using broadband spin-locking capable of efficiently observing nuclear Overhauser effects. A 90° pulse is applied to create transverse magnetization. Then, an r.f. magnetic field is applied to lock the transverse magnetization. Prior to the spin-locking, a pulse is applied to align the magnetization with the spin-locking r.f. magnetic field. Subsequent to the spin-locking, another pulse is applied to reorient the magnetization in its original direction.

5 Claims, 4 Drawing Sheets

BROADBAND SPIN-LOCKING METHOD

FIELD OF THE INVENTION

The present invention relates to a spin-locking method of nuclear magnetic resonance spectroscopy and, more particularly, to a broadband spin-locking method involving rotating magnetization before and after spin-locking.

BACKGROUND OF THE INVENTION

Generally, when two nuclear magnetizations having different resonance frequencies interact, J interaction due to electrons and NOE (nuclear Overhauser effect) interaction due to nuclear dipoles take place. Nuclear Overhauser effects are divided into longitudinal NOE and transverse NOE. The longitudinal NOE occurs in the direction of the static magnetic field, while transverse NOE is observed in a direction perpendicular to the direction of the magnetic field. Since an r.f. field is normally applied perpendicular to the static magnetic field, the transverse NOE takes place within the same plane as the r.f. field, the transverse NOE takes place within the same plane as the r.f. field. Either J interaction or an NOE interaction can be induced according to the experiment method. If the interaction is known, internuclear distances can be measured. This enables analysis of a molecular structure. The transverse NOE is also called ROESY (rotating-frame Overhauser enhancement spectroscopy). This spectroscopy is described in detail in an article entitled "Practical Aspects of Two-Dimensional Transverse NOE Spectroscopy" by Ad Bax and Donald G. Davis in *Journal of Magnetic Resonance*, 63, pp. 207–213 (1985).

In the prior art rotating-frame Overhauser enhancement spectroscopy (ROSEY) of one- or two-dimensional high-resolution NOE spectroscopy, during interaction due to NOE after the creation of transverse magnetization vertical to the static magnetic field, an r.f. field of a given strength is applied transversely to spin-lock the magnetization.

FIG. 1 shows a measuring method using spin-locking in one-dimensional NMR spectroscopy. First, a 90° pulse is applied to create transverse magnetization. Then, an r.f. field is applied in the direction of the transverse magnetization to spin-lock the magnetization. Thus, the directions of the magnetizations are aligned to cause interaction. After a lapse of a given period, the spin-locking is discontinued to permit the magnetization precessing about the axis of the static magnetic field to decay freely. The resulting free induction decay is detected to observe the interaction of magnetization.

Referring next to FIG. 2, in two-dimensional NMR spectroscopy, transverse magnetization is created by a 90° pulse. After a lapse of evolution period $t_1$, an r.f. field is applied to spin-lock the magnetization. After stopping the spin-locking, the resulting free induction decay is observed in the same way as in the aforementioned one-dimensional NMR spectroscopy. This technique is disclosed, for example, in the above-cited *Journal of Magnetic Resonance*, 63, pp. 207–213 (1985).

Where two spin systems interact with each other, such spin-locking alters the magnitudes of spin. The changes in the magnitudes are detected, whereby the interaction can be observed.

We now discuss one-dimensional NMR spectroscopy. As shown in FIG. 3, a 90° pulse is applied in the y-direction. It is assumed that the magnetization is tilted and becomes oriented in the x-direction by the application of the 90° pulse. The magnetization tilted by 90° is about to rotate within the xy-plane about the axis of the static magnetic field, but the magnetization is locked in the x-direction, because an r.f. field is immediately applied in the x-direction. However, for magnetization having a different resonance frequency, the apparent r.f. magnetic field is the vector sum of the x-direction r.f. magnetic field and the vertical component of the field because of the vertical component magnetic field which depends on the difference between the frequency of the magnetization and the resonance frequency, or offset. The vector sum is represented by RF' in FIG. 3 and tilted to the z-axis by angle $\theta$. Let $MX_0$ be off-resonance magnetization oriented in the x-direction. Since the angle formed between RF and RF' is $\theta$, what is spin-locked by the off-resonance magnetization is $MX_0 \cos \theta$. The vertical component of the spin-locked off-resonance magnetization (in the direction of RF') rotates at a high speed within a plane perpendicular to the r.f. magnetic field. Because the r.f. field is not completely homogeneous, the vertical component magnetization has inhomogeneous phases and so it cannot be observed. After discontinuing the spin-locking, interaction due to the component oriented in the same direction as RF, i.e., $MX_0 \cos^2 \theta$, is observed.

In this way, in the prior art NOE spectroscopy, the interaction is observed in the form of the intrinsic magnetization $MX_0$ multiplied by $\cos^2\theta$. As a result, the sensitivity deteriorates.

In order to avoid this deterioration, an increase in the strength of the r.f. field may be contemplated. However, if it is increased excessively, J interaction also appears other than the transverse NOE. Also, this places great burden on the instrumentation. Further, longitudinal NOE is observed, as well as transverse NOE. For these reasons, it has been impossible to increase the r.f. field sufficiently.

A method of preventing such sensitivity deterioration in two-dimensional NMR spectroscopy has been recently proposed. This method entails phasing of spectra. Especially, in one-dimensional NMR spectroscopy, sensitivity deterioration cannot be avoided.

SUMMARY OF THE INVENTION

It is an object of the present invention to provide an NMR measuring method which uses broadband spin-locking, offers high sensitivity, and permits NOE (nuclear Overhauser effects) to be efficiently observed even if the r.f. field is inhomogeneous.

The novel broadband spin-locking method involves applying a 90° pulse for creating transverse magnetization and then applying an r.f. magnetic field to lock the transverse magnetization. The method is characterized in that pulses for rotating magnetization are applied before and after the spin-locking. Before the spin-locking, the direction of the magnetization is made coincident with the direction of the spin-locking r.f. magnetic field. After the spin-locking, the rotated magnetization is returned to its original condition.

In accordance with the invention, the 90° pulse is applied to create the transverse magnetization. Irradiation of the r.f. magnetic field locks the transverse magnetization. For off-resonance magnetization, the r.f. field is apparently tilted toward the static magnetic field. Therefore, a pulse for rotating the magnetization is applied to make the direction of the off-resonance magnetization coincident with the direction of the apparently tilted spin-locking r.f. magnetic field. Hence, the magnetization is effectively spin-locked. After the spin-locking, the rotated magnetization is restored to its original condition. In this way, the strength of the magnetization can be maintained constant without attenuating it. Consequently, enhanced sensitivity is obtained.

Other objects and features of the invention will appear in the course of the description thereof which follows.

DETAILED DESCRIPTION OF THE INVENTION

Figure 5:
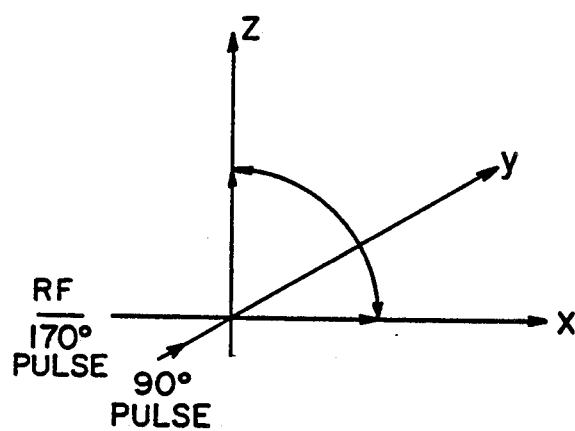
FIG. 5 is a diagram illustrating rotation of magnetization.
Figure 6:
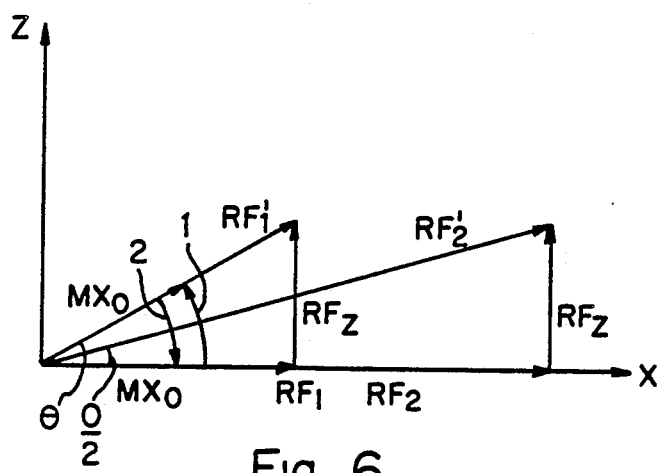
FIG. 6 is a diagram illustrating the r.f. magnetic field and the magnetization when the scheme illustrated in FIG. 4 is used.

To simplify the description, we now describe the case in which the present invention is applied to one-dimensional NMR spectroscopy. As shown in FIG. 5, a 90° pulse is applied in the y-direction to rotate the magnetization through 90°. As a result, the magnetization is oriented in the x-direction. Under this condition, a first 170° pulse is applied in the x-direction as shown in FIG. 5 during period A shown in FIG. 4. The 170° pulse is applied in the same direction as the spin-locking magnetic field. The magnitude of the 170° pulse is about twice the magnitude of the spin-locking field. Referring to FIG. 6, let $RF_1$, be the strength of the spin-locking magnetic field. Off-resonance magnetization feels a net magnetic field of strength $RF_1'$. The longitudinal component of this field $RF_1'$ is given by $RF_z$. Let $\theta$ be the angle formed between the net magnetic field $RF_1$, and the spin-locking field $RF_1$. The magnetic field $RF_z$ produced by the 170° pulse is about twice as large as the strength $RF_1$ of the spin-locking field, but their longitudinal components are identical to $RF_z$. At this time, the apparent magnetic field $RF_2'$ that the off-resonance magnetization feels is inclined from the direction of the spin-locking field $RF_1$ by about $\theta/2$. Accordingly, if the 170° pulse is applied during the period A shown in FIG. 4, then the off-resonance magnetization $MX_0$ oriented in the x-direction is rotated through 180° about the field $RF_2'$ as indicated by arrow 1. As a result, the magnetization $MX_0$ is oriented in the direction of the field $RF_1'$. In this state, the spin-locking magnetic field is applied to lock the magnetization $MX_0$. Of course, this locking experiment is performed for each different magnetization. Under this locked condition, nuclear Overhauser effects (NOE) take place. After a lapse of a given time, a second 170° pulse is applied in the same way as the foregoing. The magnetization $MX_0$ lying in the direction of the field $RF_1'$ is rotated through 180° about the apparent magnetic field $RF_2'$ as indicated by arrow 2, so that the magnetization is oriented in the x-direction. Therefore, the magnetization strength is not attenuated before and after the spin-locking. Hence, nuclear Overhauser effects are observd with high sensitivity. Shift of magnetization by the use of a pulse rotating through 180° between the x-axis and the direction of the spin-locking is described by R. Freeman, S.P. Kempsell, and M.H. Levitt in *Journal of Magnetic Resonance*, 38, p. 453 (1980), but application to NOE has not been attempted.)

In two-dimensional NMR spectroscopy, because of the presence of an evolution period, the magnetization thrown into the x-direction by the 90° pulse disperses within the xy-plane. Immediately prior to the irradiation of the 170° pulse, the x-component is effectively spin-locked and the NOE is observed in the same manner as in one-dimensional NMR spectroscopy.

In the present example, the 170° pulse is used for the following reason. Theoretically, the use of a 180° pulse is more desired. In practice, the longitudinal component contributes to the magnetic field, as well as the r.f. magnetic field. Therefore, the pulse is reduced to compensate for the effects of the longitudinal component. For this reason, the pulse is not strictly restricted to a 170° pulse. Rather, it may be appropriately set according to the conditions, as long as it can rotate the magnetization through 180°.

In the above description, the strength of the magnetic field applied during period A is about twice as strong as the strength of the spin-locking magnetic field. In brief, the factor is so set that vector $RF_2'$ approximately bisects the angle made between vector $RF_1$ and vector $RF_1'$.

Figure 7:
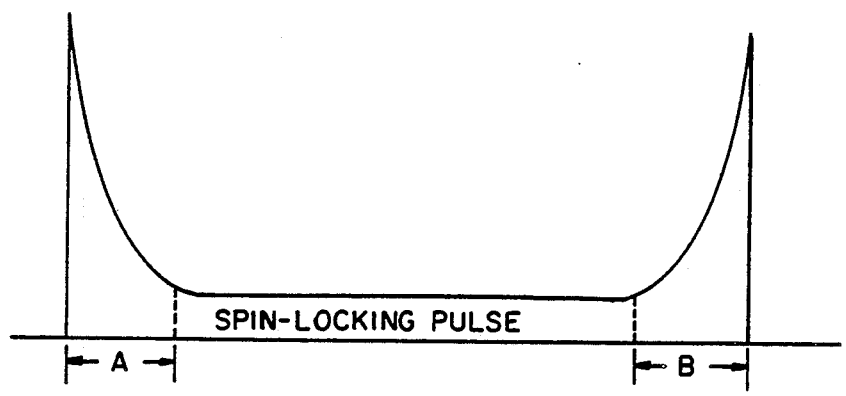
FIG. 7 is a diagram illustrating another spin-locking scheme according to the invention.

FIG. 7 illustrates another spin-locking method according to the invention, the method using adiabatic pulses. In this example, adiabatic pulses are applied before and after irradiation of a spin-locking field. The waveshape changes gradually, unlike the pulses shown in FIG. 4. When the strength of the r.f. magnetic field is varied slowly compared with the scheme shown in FIG. 4 where a 170° pulse is applied during period A, the inclination of the rotating axis $RF_2$ shown in FIG. 6 gradually varies. Concomitantly, the magnetization varies gradually. At the same time, when the spin-locking field is applied, the off-resonance magnetization can be oriented in the direction of $RF_1'$ shown in FIG. 6. As soon as the spin-locking is discontinued, the r.f. magnetic field is gradually increased during period B in an opposite relation to the process in the period A. The rotating axis is gradually returned to the x-axis. In this way, the magnetization can be returned to the x-direction. In the present example, since adiabatic pulses are employed, nuclear Overhauser effects can be efficiently observed even if the r.f. magnetic field is inhomogeneous. A method of transferring magnetization in an adiabatic manner is known, as described in an article entitled "The Principle of Nuclear Magnetism", Chaps. 1, 2, by A. Abragam, Oxford Univ. Press. London 1961. However, application of this method to spin-locking has not been attempted. This example is also applicable to two-dimensional NMR spectroscopy, in the same way as the example described in conjunction with FIG. 4.

Figure 8:
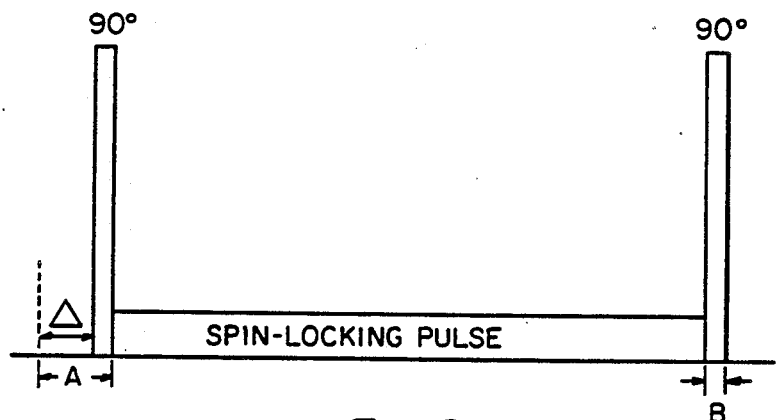
FIG. 8 is a diagram illustrating a further spin-locking scheme according to the invention.
Figure 9:
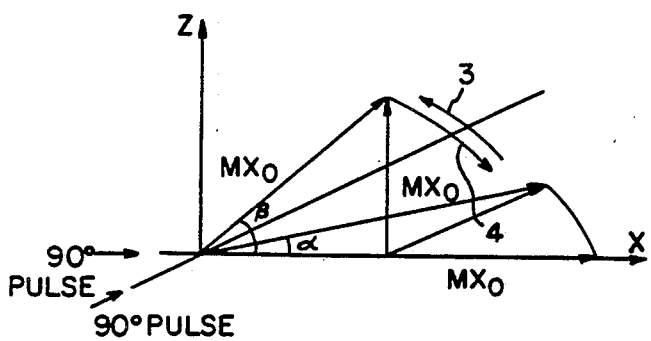
FIG. 9 is a diagram illustrating the spin-locking scheme illustrated in FIG. 8.

FIG. 8 shows a further pulse sequence according to the invention. In this example, a 90° pulse is applied to create transverse magnetization. After a lapse of a given time $\Delta$, a very intense 90° pulse is applied in the y-direction. As shown in FIG. 9, magnetization $MX_0$ rotates through an angle, for example, $\alpha$, within the xy-plane during the period $\Delta$. The irradiation of the very intense 90° pulse throws the magnetization into the xz-plane as indicated by 3 in FIG. 9. All the magnetization existing within the xy-plane is thrown into the xz-plane. The period $\Delta$ is so adjusted that the off-resonance magnetization in the xz-plane is oriented in the direction of $RF_1$, shown in FIG. 6. In this state, the magnetization can be effectively spin-locked. When the spin-locking is discontinued, a very intense 90° pulse is also applied to return the magnetization to the original xy-plane. Then, the magnetization disperses within the xy-plane. Thus, the nuclear Overhauser effects can be detected with high sensitivity by x- and y-direction detectors.

In two-dimensional NMR spectroscopy, even if the magnetization is thrown into the xy-plane and dispersed, the signal is sampled while varying the evolution period $t_1$ and so the present example is not meaningfully applied to two-dimensional NMR spectroscopy.

Figure 1:
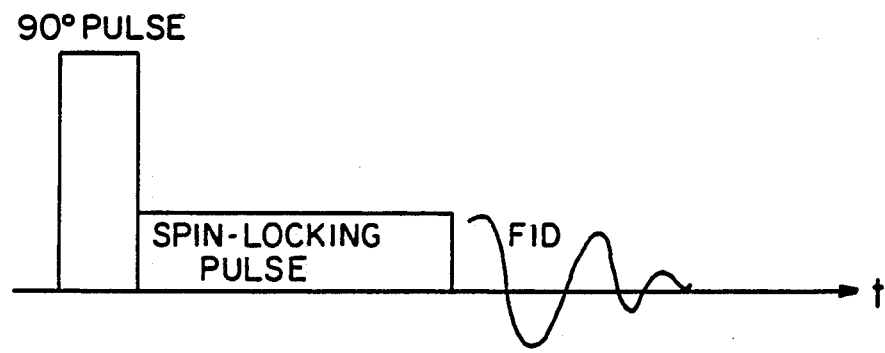
FIG. 1 is a diagram illustrating a method of measuring one-dimensional NMR.
Figure 2:
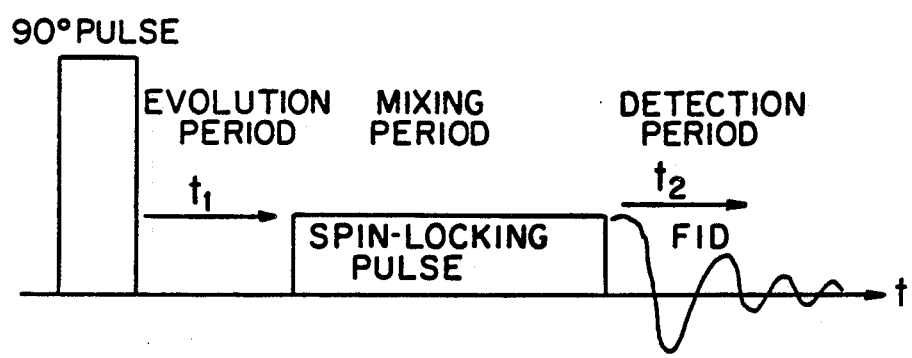
FIG. 2 is a diagram illustrating a method of measuring two-dimensional NMR.
Figure 3:
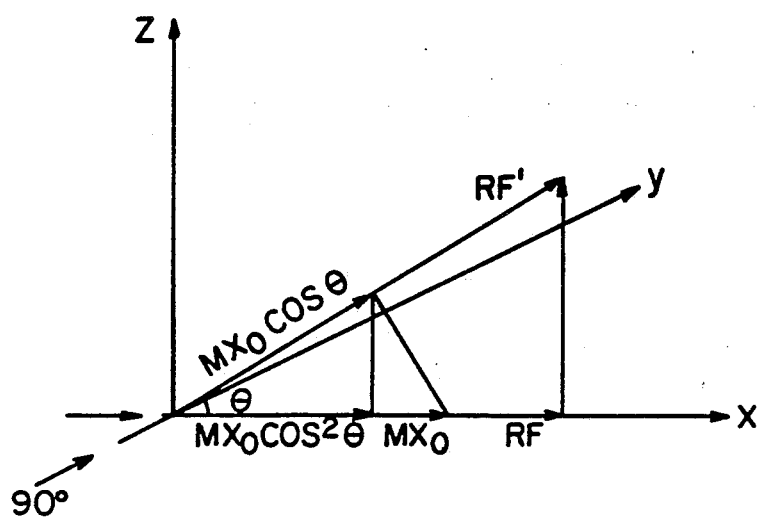
FIG. 3 is a diagram illustrating the prior art spin-locking scheme.
Figure 4:
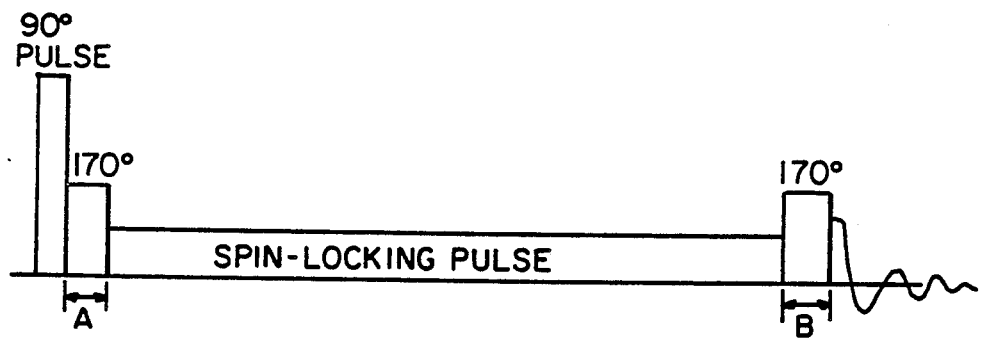
FIG. 4 is a diagram illustrating a spin-locking scheme according to the invention.

In the example illustrated in FIG. 8, if the spin-locking method illustrated in FIGS. 4 or 7 is used, the x-component of the magnetization dispersed during the period $\Delta$ is effectively spin-locked. Therefore, it is not necessary to adjust the period $\Delta$, for phasing. A method not using the period $\Delta$ is disclosed in *Journal of Magnetic Resonance*, 75, p. 261 (1987) by C. Griesinger and R. R. Ernst, but this method is unable to enhance sensitivity in one-dimensional NMR spectroscopy.

Figure 10:
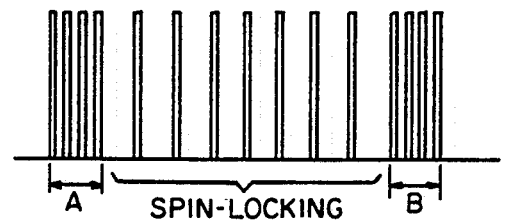
FIG. 10 is a diagram illustrating a still other spin-locking scheme according to the invention, and in which an r.f. magnetic field of a given strength is used.

FIG. 10 shows a further example of the invention. In the above examples, the intensity of the r.f. magnetic field is varied. In this example, pulses which have a given amplitude and a small flip angle are applied during periods A and B at a higher duty factor that in the spin-locking period. This method is equivalent to irradiation of an intense r.f. magnetic field during periods A and B. Since the magnitude of the r.f. magnetic field is constant, it is not necessary to control the magnitude.

Figure 11:
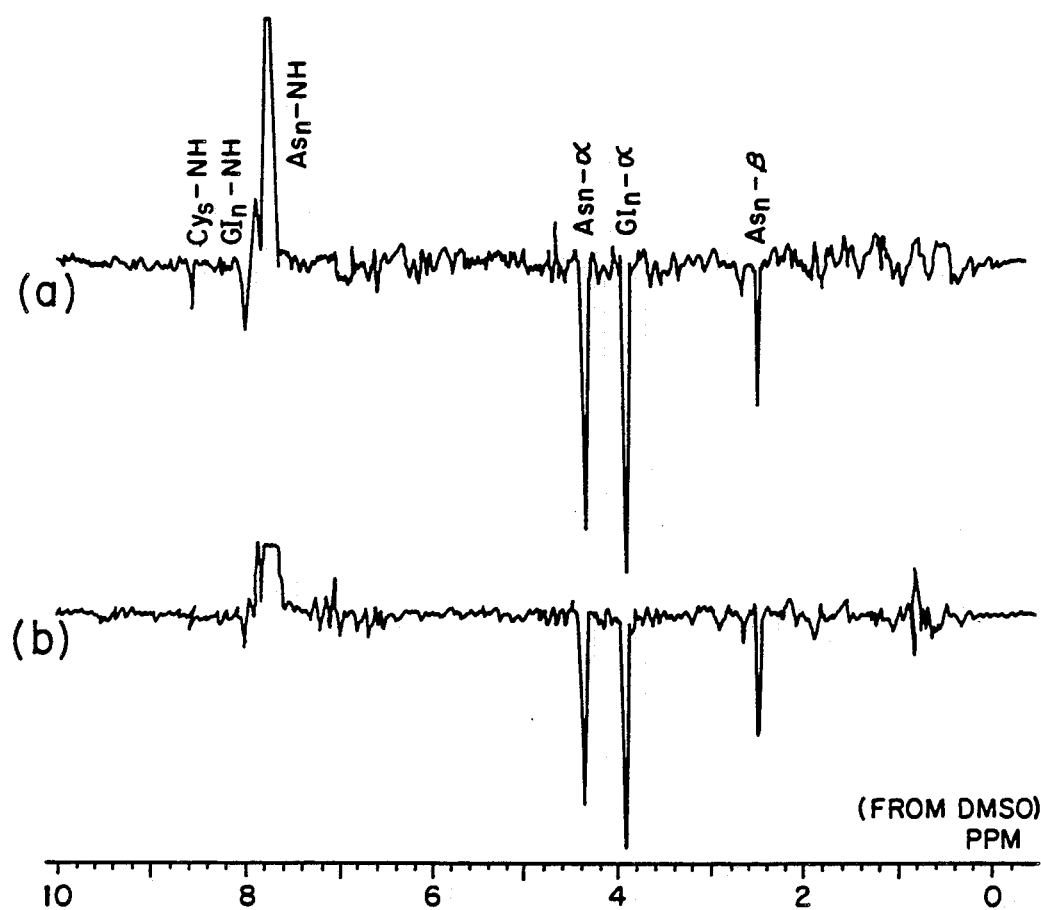
FIG. 11(a) shows a spectrum obtained in accordance with the invention.
FIG. 11(b) shows a spectrum obtained, using the prior art spin-locking techniques.

FIG. 11(a) shows a spectrum derived in accordance with the invention. FIG. 11(b) shows a spectrum obtained by the prior art spin-locking techniques. As $_n$—NH is a very large peak appearing on a diagonal line in a two-dimensional NMR spectrum. Peaks $Cy_s$—NH, $GI_n$—NH, $As_n$—NH, $As_n$—$\alpha$, $GI_n$—$\alpha$, and $As_n$—b arise from nuclear Overhauser effects. It can be seen by comparing these two spectra that the invention yields greatly enhanced sensitivity.

As described thus far, in accordance with the present invention, magnetization is shifted between the locking direction and a transverse plane before and after the spin-locking period during which the magnitude of the r.f. magnetic field is kept constant. Therefore, nuclear Overhauser effects can be observed with improved sensitivity. Also, when the adiabatic method illustrated in FIG. 5 is used, nuclear Overhauser effects can be observed efficiently even if the r.f. field is inhomogeneous. Further, the use of a train of time-shared pulses of a small flip angle makes it unnecessary to control the magnitude of the r.f. field.

Having thus described my invention with the detail and particularity required by the Patent Laws, what is claimed and desired to be protected by Letters Patent is set forth in the following claims.

What is claimed is:

1. A broadband spin-locking method of spin-locking magnetization by apply an r.f. magnetic field after applying a 90° pulse for creating transverse magnetization, said method comprising the steps of:

applying a first r.f. pulse in the direction of the transverse magnetization to rotate the magnetization so that it may be aligned with the spin-locking r.f. magnetic field before the spin-locking;

applying a spin-locking pulse; and applying to a second pulse in the direction of the transverse magnetization so that the magnetization may be reoriented in its r.f. direction after the spin-locking and prior to detection.

2. The broadband spin-locking method of claim 1, wherein the first and second pulses for rotating the magnetization have a magnitude about twice as large as the magnitude of the spin-locking r.f. magnetic field and act to rotate the magnetization through 180°.

3. The broadband spin-locking method of claim 1, wherein the first and second pulses for rotating the magnetization are adiabatic pulses whose amplitudes gradually vary.

4. The broadband spin-locking method of claim 1, wherein the first and second pulses for rotating the magnetization are intense 90° pulses, one of which is applied after a lapse of a given period following the application of the 90° pulse for creating the transverse magnetization and before the spin-locking.

5. The broadband spin-locking method of claim 1, wherein the first and second pulses for rotating the magnetization are higher in magnitude and duty factor than the spin-locking r.f. magnetic field.

* * * * *